United States Patent [19]

Schaffer

[11] Patent Number: 4,859,963
[45] Date of Patent: Aug. 22, 1989

[54] HIGH SPEED LOW GAIN STABLE AMPLIFIER

[75] Inventor: Gregory L. Schaffer, Sunnyvale, Calif.

[73] Assignee: Maxim Integrated Products, Sunnyvale, Calif.

[21] Appl. No.: 198,048

[22] Filed: May 24, 1988

[51] Int. Cl.$^4$ .............................................. H03F 3/45
[52] U.S. Cl. ................................... 330/253; 330/255; 330/257
[58] Field of Search ........................ 330/253, 257, 255

[56] References Cited

U.S. PATENT DOCUMENTS

| | | | |
|---|---|---|---|
| 4,247,824 | 1/1981 | Hilbourne | 330/253 |
| 4,542,348 | 9/1985 | Lucas et al. | 330/253 |
| 4,689,607 | 8/1987 | Robinson | 330/257 X |

Primary Examiner—James B. Mullins
Attorney, Agent, or Firm—Blakely, Sokoloff, Taylor & Zafman

[57] ABSTRACT

The present invention is a high speed, low gain stable amplifier. The amplifier is for amplifying an input signal and providing an output signal to a known, fixed load. The amplifier has a first stage that is a differential amplifier that amplifies the input signal. The amplifier then has a second stage which is a push pull transconductance stage which operates at a low gain (approximately unity gain), and the transconductance of the push pull transconductance stage is approximately equal to the reciprocal of the impedance of the predetermined load. The push pull transconductance stage includes first and second driver transistors. These driver transistors control the output signal. The amplifier of the invention provides amplification of a wide bandwidth with minimal phase shift.

11 Claims, 2 Drawing Sheets

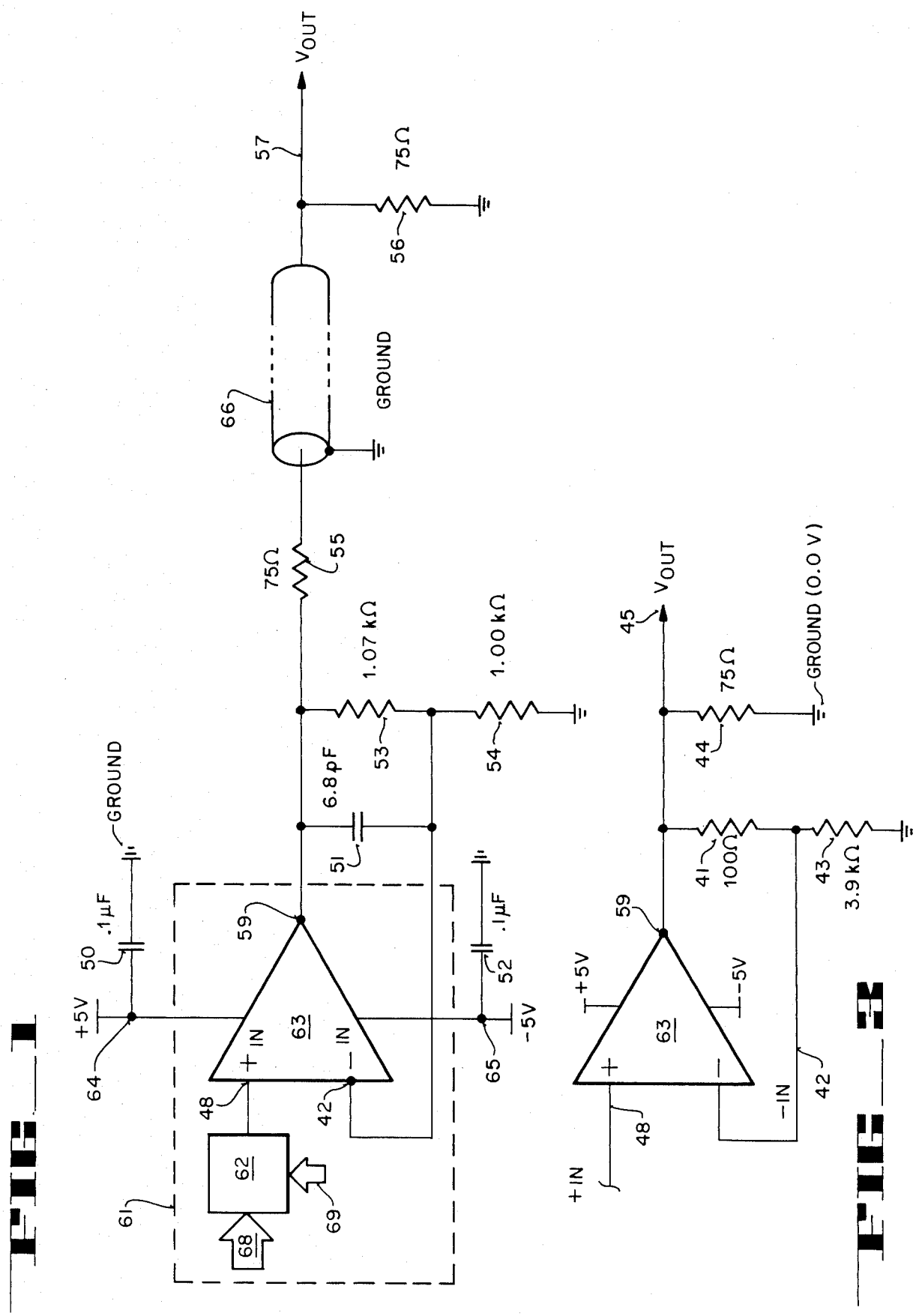

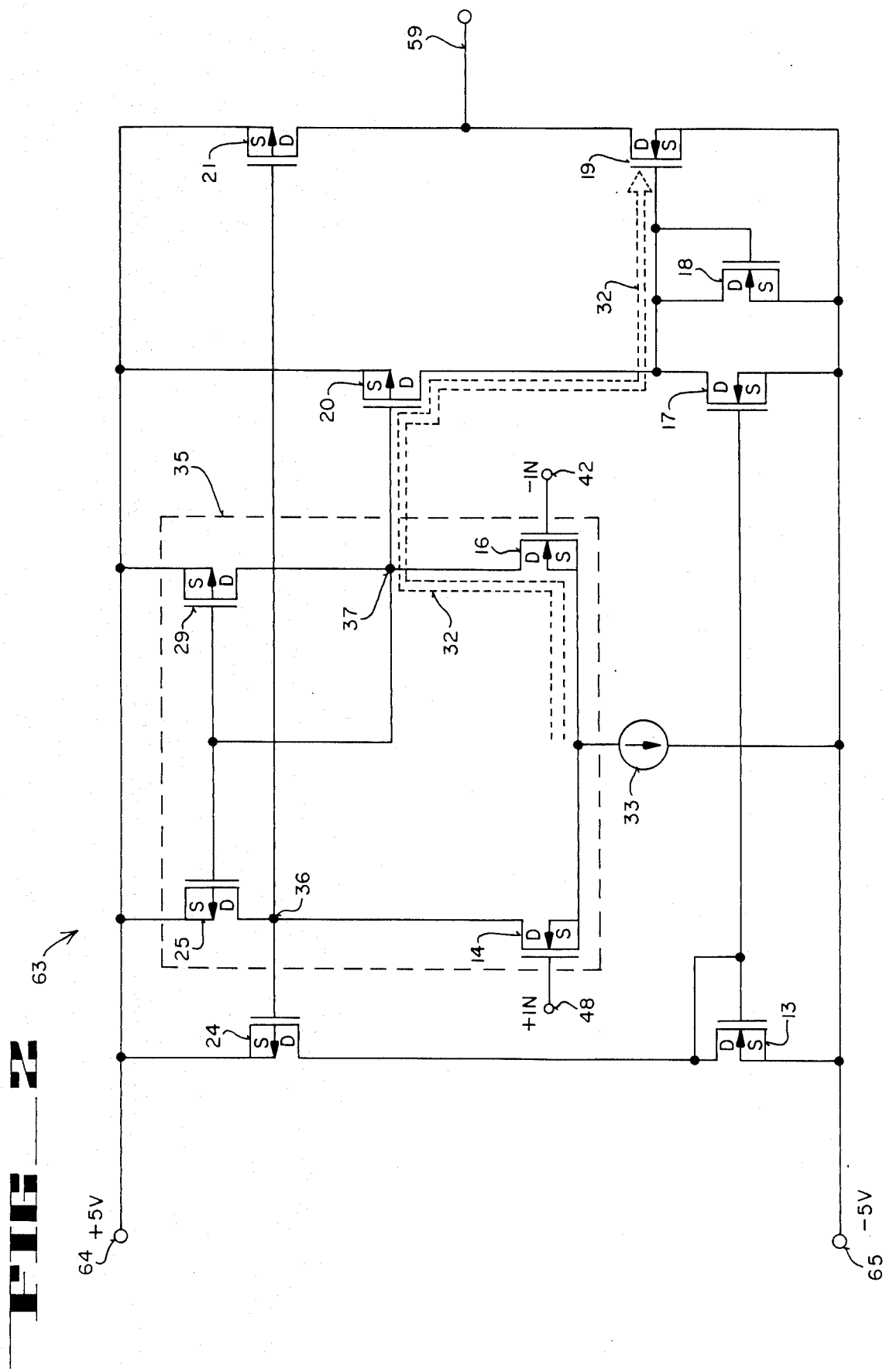

HIGH SPEED LOW GAIN STABLE AMPLIFIER

BACKGROUND OF THE INVENTION

1. Field of the Invention

The field of the invention is operational amplifiers and particularly relates to operational amplifiers for driving fixed load impedances.

2. Prior Art

Many operational amplifiers in the prior art provide voltage amplification. Most operational amplifiers have two or more stages of gain. Multi-stage operational amplifiers have a tendency to phase shift their output signal with respect to their input signal. In order to maintain stability in the amplifier, the phase shift of the output signal must be less than 180 degrees at unity gain frequency. In order to satisfy this condition, additional phase compensation circuitry is used. However, phase compensation circuitry severely reduces the bandwidth of the amplifier. Also the phase compensation circuitry introduces a delay in the processing of the output signal. Thus, having phase compensation circuitry in an operational amplifier reduces both the bandwidth of the amplifier as well as the amplifier's speed.

An example of an operational amplifier having ultra-low input current and low power dissipation is the Intersil 76XX series low power CMOS operational amplifier. A particular circuit configuration used in those amplifiers is described in U.S. Pat. No. 4,529,948 (Bingham). In these circuits the second stage has a gain of 30-40 dB, which means that for high impedance loads, the output of the second stage does not match the load. These circuits are load dependent, and phase compensating circuits are required for their operation. Also, to achieve unit gain these devices require the use of a capacitor. Therefore, these prior art operational amplifiers suffer from reduced bandwidth and speed.

It is an object of the present invention to provide a high speed amplifier that matches the output signal to the output load. Another object of the present invention is to provide a high speed amplifier that drives a predetermined load over a large bandwidth. An additional object of the present invention is to provide an amplifier having a second stage of unity gain. Yet another object of the present invention is to provide an amplifier having a minimal phase shift without having compensation circuitry. A further object of the present invention is to provide an amplifier that can provide unity gain stability without the use of capacitors.

SUMMARY OF THE INVENTION

The present invention is a high speed low gain operational amplifier for amplifying signals for application to a predetermined load having a fixed impedance. The operational amplifier comprises a first stage and a second stage. The first stage is a differential amplifier stage which provides the voltage gain of the operational amplifier. The second stage is a push pull transconductance stage. This second stage is designed so that the transconductance of the second stage is the reciprocal of the impedance of the load. This keeps the amplifier stable without using phase compensation components. The second stage provides approximately unity gain in driving the predetermined load. The operational amplifier has wide bandwidth with a minimal phase shift.

One typical use of the circuit is that of a stable unity gain video amplifier capable of driving a 75 ohm load directly. The amplifier is able to operate on a small voltage supply and typically consumes a relatively small amount of power.

DETAILED DESCRIPTION OF THE DRAWINGS

FIG. 1 is a schematic diagram showing a use of the amplifier of the present invention.

FIG. 2 is a circuit diagram of the preferred embodiment of the amplifier of the invention.

FIG. 3 is a schematic diagram showing another use of the amplifier of the present invention.

DETAILED DESCRIPTION OF THE PRESENT INVENTION

The present invention describes a high speed, low gain operational amplifier. In the following description, numerous specific details are set forth in order to provide a thorough understanding of the present invention. It will be obvious, however, to one skilled in the art that the present invention may be practiced without these specific details. In other instances, well known methods and structures have not been described in detail so as not to unnecessarily obscure the present invention.

FIG. 1 shows a circuit using the high speed, low gain amplifier 63 of the present invention. The circuit shown uses CMOS technology and is used to drive a back terminated 75 ohm ($\Omega$) cable 66. The circuit of FIG. 1 may be used as a video amplifier. The amplifying circuitry is shown in FIG. 1 as multiplexed amplifier circuit 61. The multiplexed amplifier circuit 61 is comprised of multiplexer 62 and a high speed, low gain amplifier 63. In the preferred embodiment, multiplexer 62 provides for selecting one of the 8 channels that comprise input channels 68 for amplification through amplifier 63, with the selected channel specified by three bit lines that comprise selector signal 69. Input channels 68 and selector signal 69 are coupled to multiplexer 62. The structure and operation of the multiplexer 62 are well known in the prior art. On the basis of the selector signal 69, multiplexer 62 sends one input signal, from input channels 68, to amplifier 63. Amplifier 63 has both a first stage and a second stage of amplification as will become apparent when FIG. 2 is described below.

Referring again to FIG. 1, a positive voltage supply source and a negative voltage supply source are coupled to amplifier 63 through the positive terminal 64 and the negative terminal 65 respectively. The positive voltage supply source provides a potential of approximately +5 volts (V) and the negative voltage supply source provides a potential of approximately −5V. These voltage supply sources may be obtained from any standard integrated circuit voltage regulator that provides voltages of +5V and −5V with respect to ground. The line which couples the +5V voltage supply with amplifier 63 is also coupled to a capacitor 50. Capacitor 50 is a power supply bypass capacitor rated at 0.1 microFarads ($\mu$F). Capacitor 50 is coupled between the positive terminal 64 and ground. The line coupling the −5V voltage supply to amplifier 63 is also coupled to capacitor 52. Capacitor 52 is a power supply bypass capacitor. Capacitor 52 is rated at 0.1 $\mu$F. Capacitor 52 is coupled between the negative terminal 65 and ground.

Amplifier 63 has an output terminal 59 and input terminals +IN 48 and −IN 42. Coupled in parallel between output terminal 59 and input terminal −IN 42 is a capacitor 51 and a resistor 53. Coupled between −IN 42 and ground is resistor 54. Input terminal +IN 48 receives an input signal from multiplexer 62; in the preferred embodiment this signal is a video signal. Input terminal −IN 42 receives a signal generated by the output of the amplifier, or what is commonly known in the art as feedback.

Capacitor 51 serves to minimize the phase distortion, and typically has a value of 6.8 picoFarads (pF). Capacitor 51 is not necessary for the practice of the present invention. Capacitor 51 serves as high frequency compensation of the feedback loop. The amplifier's closed loop gain is determined by the resistive values of resistors 53 and 54. The amplifier's closed loop gain can be calculated by the following equation (equation "1"):

$$\frac{V_{OUT}}{V_{IN}} = \frac{G \times (R53 + R54)}{(G \times R54) + (R53 + R54)}$$

Where G is the open loop gain of the amplifier, R53 and R54 are resistors 53 and 54 respectively, and $V_{out}$ and $V_{in}$ are output and input voltages, respectively. In the preferred embodiment of the present invention where the amplifier drives a 75Ω video cable as shown in FIG. 1, resistor 53 has a value of 1.07 kΩ and resistor 54 has a value of 1 kΩ.

The load is represented by resistors 55 and 56. In the preferred embodiment, both resistors 55 and 56 have a resistance of 75Ω. The video cable 66 is typically a coaxial cable having an internal conductor and an external grounded shielding which surrounds the internal conductor. The resistor 55 is coupled between amplifier output terminal 59 and the internal conductor at a first end of video cable 66. The internal conductor at the second end of video cable 66 is in turn coupled to output signal 57 and to resistor 56. Resistor 56 is coupled between the internal conductor of video cable 66 and ground.

FIG. 2 is a circuit diagram of the amplifier 63 of FIGS. 1 and 3. Both positive terminal 64 and negative terminal 65 are coupled to the amplifier circuit as shown in FIG. 2. Positive terminal 64 provides a potential of +5V and negative terminal 65 provides a potential of −5V. Transistors 13, 14, 16, 17, 18 and 19 are n-channel MOS field effect transistors. Transistors 20, 21, 24, 25 and 29 are p-channel MOS field effect transistors. The amplifier 63 includes two stages: a first stage, which is a differential amplifier, and a second stage which is a push-pull transconductance stage. The first stage differential amplifier includes transistors 14, 16, 25 and 29 (shown collectively by reference numeral 35), and the constant current source 33 may also be considered part of the first stage amplifier. The second stage includes transistors 13, 17, 18, 19, 20, 21 and 24.

As shown in FIG. 2, the differential amplifier has +IN and −IN input terminals for receiving the differential input signals for the first stage; in particular, the gate of transistor 14 is coupled to the +IN 48 input terminal, and the gate of transistor 16 is coupled to the −IN 42 input terminal. In a typical embodiment of the invention, the voltage gain from the first stage (which gain appears at the output of the first stage at output node 36) is approximately 40 times the difference in voltage between the input signals at input terminals +IN 48 and −IN 42.

As shown in FIG. 2, the output of the amplifier circuit, output terminal 59, is driven by transistors 21 and 19. Transistor 21 has a source coupled to positive terminal 64 and a drain coupled to output terminal 59. The gate of transistor 21 is coupled to the output node 36 of the first stage of the amplifier 63. Transistor 19 has a drain coupled to output terminal 59 and a source coupled to negative terminal 65. Transistors 24, 13, 17, 18 and 20 are used to properly bias and drive transistor 19.

The amplifier circuit of FIG. 2 has a current source 33 that provides a constant current. The current source 33 may be any one of many well known circuits for providing a constant current source. One end of the current source 33 is coupled to the sources of transistors 14 and 16 and the other end of the current source 33 is coupled to the negative terminal 65. Transistor 14 has a gate coupled to +IN 48. The drain of transistor 14 is coupled to first stage output node 36. First stage output node 36 is also coupled to the drain of transistor 25 and to the gates of transistors 21 and 24. Transistor 16 has a gate coupled to −IN 42. The drain of transistor 16 is coupled to internal node 37. Internal node 37 is also coupled to the gates of transistors 25, 29, and 20 and to the drain of transistor 29. Transistor 29 has a source coupled to the positive terminal 64. Transistor 25 also has a source coupled to the positive terminal 64. Transistors 14, 16, 25, and 29 and the constant current source 33 form the differential amplifier that is the first stage of the amplifier 63. First stage output node 36 drives the push pull transconductance stage by affecting the conductivity of transistor 24. First stage output node 36 directly drives transistor 21, more quickly influencing transistor 21's conductivity than transistor 19.

The push pull transconductance stage affects the conductivity of transistor 19 with a high degree of accuracy, as described below. Referring again to FIG. 2, transistor 24 has a source coupled to positive terminal 64, a gate coupled to first stage output node 36, and a drain coupled to the drain and gate of transistor 13. The gate of transistor 13 is coupled to the gate of transistor 17. Transistor 13 also has a source coupled to negative terminal 65, and transistor 17 has a source coupled to negative terminal 65. The drain of transistor 17 is coupled to transistor 20's drain, transistor 19's gate, and transistor 18's drain and gate. Transistor 20's source is coupled to positive terminal 64 and its gate to internal node 37. Transistor 18 has a source coupled to negative terminal 65.

The push-pull transconductance stage includes the high speed driver path 32, as shown in FIG. 2, which provides for a low impedance path to relatively quickly affect the conductivity of transistor 19. High speed driver path 32 begins at transistor 16, which is the source of any change of current on internal node 37. The path 32 passes by internal node 37 to transistor 20. Transistor 29 has a relatively low impedance so that changes at internal node 37, which is coupled to the gate of transistor 20, quickly affects the drain current of transistor 20. Thus the path 32 continues from the drain of transistor 20 to the gate of driver transistor 19. Transistor 18 keeps the impedance at the drain of transistor 20 low in order to maintain a high bandwidth response from the amplifier 63. The high speed driver path 32 has the effect of hastening the response of the amplifier by quickly responding to the feedback received by −IN 42. Because current source 33 provides a constant current, that current must pass through either transistor 14 or 16. The magnitude of the difference between +IN 48 and −IN 42 determines the percentages of the constant current that passes through transistors 14 and 16. Thus, internal node 37's current is the complement of the current present on first stage output node 36. It will be appreciated that, for each of the transistors shown in FIG. 2, there is a current path of the transistor formed between the source and drain of the transistor and that each current path has a one end and an other end.

First stage output node 36 quickly affects transistor 21, which is one of the two driver transistors that drive amplifier output terminal 59. The other driving transistor, transistor 19, is not immediately affected by a change in the current through output node 36. Output node 36 affects transistor 24, which then affects transistor 13, in turn affecting transistor 17 that will then operate to modify the state of driver transistor 19. In this manner, a change in the current of output node 36 is precisely traced by the push pull transconductance stage as described below, albeit more slowly than transistor 21 responds. To compensate for this initial period between the change of input current and the effect of the entire push pull transconductance stage on transistor 19, high speed driver path 32 is able to quickly affect transistor 19 because transistor 20 is designed to have low gain by virtue of its size relative to the other devices in amplifier 63 (see, e.g. Table 1 below).

This amplifier circuitry shown in FIG. 2 provides for a maximum bandwidth, although the voltage gain of the amplifier is relatively low. In the preferred embodiment the first stage gain is approximately 40V/V (i.e. 40V output for 1V input). However, because the second stage operates as a low gain (e.g. unity gain) amplifier to drive a 75Ω load (e.g. the use of the amplifier as a video amplifier), the gain of the first stage is typically sufficient. In addition, the circuit provides speeds that are much faster than other circuits using two stages of non-unity gain because the present invention does not require phase compensation circuitry.

The operation of the amplifier 63 will now be described with reference to FIG. 2 and Table 1 (below). In normal bias conditions, that is when +IN 48 and −IN 42 are at the same potential, the drain current of transistor 20 is twice that of transistor 24. This is a result of transistor 20 being twice the size of transistor 24 (see discussion accompanying Table 1 below). Transistors 13 and 17 have the same size and comprise a current mirror that reflects the drain current of transistor 24, which in the preferred embodiment is 2 milliAmps (mA) so that the current through transistor 17 is equal to the current through transistor 24. In the preferred embodiment, transistor 20 has twice the amount of current present on transistor 24, or 4 mA. Because of this difference, there is a 2 mA current that flows into the drains of each of transistors 17 and 18. Transistor 17 and 18 also have the same size, and under normal biasing have the same current. Transistor 19 is matched to transistor 18 such that transistor 19 is five times as large as transistor 18 (see table 1). Thus, transistor 19 then has a drain current of 10 mA. Also, transistor 21 is matched to transistor 24 such that transistor 21 is five times larger than transistor 24. Thus, transistor 21 has a drain current of 10 mA. By this arrangement, transistors 19 and 21 have identical currents, under normal bias conditions.

The circuit responds to changes in input conditions as described below. A change in the voltage at first stage output node 36 ripples through the circuit. As an example, suppose that the voltage at the first stage output node 36 slightly decreases such that the current through the source and drain of transistor 24 increases by 0.1 mA. Transistor 24's increased current is multiplied by five on transistor 21, giving it an increased current of 10+(5×0.1)=10.5 mA. That is, transistor 21's original current (10 mA) is increased by five times the increase in transistor 24 (5×0.1 mA) to yield 10.5 mA.

After the increase in transistors 21 and 24, transistor 20's current is approximately the same. However, transistors 13 and 17 now have 2.1 mA current through each of those transistors. The difference between the drain current of transistor 20 and that of transistor 17, (4−2.1=1.9 mA), becomes the drain current of transistor 18. Transistor 18's current of 1.9 mA is reflected in transistor 19's current by a factor of 5, or 9.5 mA.

The output current that is present on amplifier output terminal 59 is the difference between the drain current of transistor 21 and the drain current of transistor 19. Using the example above, the output current would be:

$$10.5 - 9.5 = 1 \text{ mA}$$

The transconductance of the output stage is determined by the size of the transistors. The layout sizes are in terms of a ratio of gate width over gate length (distance majority charge carriers travel from source to drain). In the preferred embodiment, the sizes are shown in Table 1. The units shown represent 1.25 microns. Thus 4 units is 4×1.25=5 microns long.

TABLE

| Transistor | Layout Size |
|---|---|
| 13 | 160/4 |
| 14 | 480/6 |
| 16 | 480/6 |
| 17 | 160/4 |
| 18 | 160/4 |
| 19 | 800/4 |
| 20 | 640/4 |
| 21 | 1600/4 |
| 24 | 320/4 |
| 25 | 480/6 |
| 29 | 480/6 |

With these sizes, the second stage of the amplifier circuit 63 has a transconductance of 1/75 mhos (gm). This circuit, which in the preferred embodiment is used to drive a 75Ω load, has an transconductance stage output voltage gain of 1V/V, or unity gain and the transconductance of the second stage is equal to the reciprocal of the impedance of the load.

FIG. 3 shows an alternative embodiment using an amplifier 63 of the present invention. In this embodiment, the circuitry is designed to provide a unity gain for a load of 75Ω. Amplifier 63 is coupled to input lines +IN 48 and −IN 42 and is coupled to receive +5V and −5V from a power supply. Amplifier 63 also has an output 59. The same amplifier circuit shown in FIG. 2 and described above is used in the embodiment shown in FIG. 3. A resistor 41 is coupled between output 59 and −IN 42. A resistor 43 is coupled between −IN 42 and ground. It is the resistance of resistors 41 and 43 that provide for the unity gain of the circuit shown in FIG. 3. To provide for unity gain using the circuit of FIG. 2, resistor 41 is approximately 100Ω and resistor 43 is approximately 3.9 kΩ. Resistor 44 is shown having a resistance of 75Ω. Resistor 44 is the load of the amplifier. The gain of a specific application of the amplifier 63 shown in FIG. 2 depends on the resistance of the two resistors coupled to the amplifier circuit and the open loop gain of amplifier 63. The relationship can be expressed by the equation shown above in regards to FIG. 1. Thus the amplifier circuit of the present invention can be used with various combinations of resistors to drive a wide range of predetermined loads.

An alternate configuration of transistor layout sizes may be used to give substantially equivalent performance and additionally has the advantage of using only 75% of the power of the configuration in Table 1. Table 2 shows this configuration, again with the layout sizes in terms of the ratio of gate width over gate length:

TABLE 2

| Transistor | Layout Size |
|---|---|
| 13 | 192/5 |
| 14 | 512/4 |
| 16 | 512/4 |
| 17 | 192/5 |
| 18 | 192/5 |
| 19 | 832/5 |
| 20 | 640/5 |
| 21 | 1600/5 |
| 24 | 320/5 |
| 25 | 192/5 |
| 29 | 192/5 |

These values are matched as the values of Table 1 are matched, except for transistors 18 and 19. Still, the ratio is sufficiently close to 5, being 832:192, or 4⅓. Although the Table 2 circuitry occupies slightly more space than the Table 1 circuitry, a reduction in power consumption is achieved.

Thus, a high speed, low gain stable amplifier has been described. It will be appreciated that the invention may be utilized without using specific embodiments disclosed herein.

For example, even though the size of transistor 21 is shown (in Table 1) as five times the size of transistor 24, the invention may use a transistor 21 which is anywhere from 3 to about 30 times the size of transistor 24. Similarly, transistor 19 may have a size which is 3 to about 30 times the size of transistor 18.

I claim:

1. A low gain amplifier circuit for amplifying the voltage difference between differential input signals, and providing an output signal to a predetermined load, said amplifier circuit comprising:
    a differential amplifier stage, coupled to said input signals, for amplifying said difference between the differential input signals, said differential amplifier stage having no frequency compensation components;
    a push pull transconductance stage, coupled to said differential amplifer stage and to said predetermined load, the transconductance of said push pull transconductance stage being approximately equal to the reciprocal of the impedance of said load, said push pull transconductance stage having approximately a unity gain to provide amplification of wide bandwidth signals with minimal phase shift, said push pull transconductance stage having a first driver transistor, coupled to said differential amplifier stage, for driving said output signal and having a second driver transistor, coupled to said first driver transistor, for driving said output signal said push-pull transconductance stage having no frequency compensation components.

2. The amplifier circuit as described in claim 1 wherein said differential amplifier stage further comprises:
    a first pair of transistors having gates coupled to said differential input signals, one of said first pair of transistors having a current path coupled between a current source and an output node of said differential amplifier stage, and the other of said first pair of transistors having a current path coupled between said current source and an internal node;
    a second pair of transistors coupled to said first pair of transistors such that said second pair of transistors operate as a current minor, said second pair of transistors having sources coupled to a positive voltage source and gates coupled to said internal node, said output node having a current that is a multiple of the difference between the voltages present on said gates of said first pair of transistors, and said internal node having a current which is the complement of the current on said output node, said push-pull transconductance stage being coupled to said output node and said internal node;
    said push-pull transconductance stage further comprising a first transistor having a gate coupled to said internal node, a source coupled to said positive voltage source, and a drain coupled to the gate of said second driver transistor. said first pair of transistors and said first transistor have relatively low impedances thereby creating a driver path such that said second driver transistor is relatively quickly affected by changes in the difference between the voltages present on the gates of said first pair of transistors.

3. A low gain amplifier circuit for amplifying the difference between differential input signals and providing an output signal to a predetermined load, said low gain amplifier circuit comprising:
    a differential amplifier stage being coupled to said differential input signals, said differential amplifier stage comprising a first pair of transistors having gates coupled to said differential input signals, one of said first pair of transistors having a current path coupled between a current source and an output node of said differential amplifier stage, and the other of said first pair of transistors having a current path coupled between said current source and an internal node; a second pair of transistors coupled to said first pair of transistors such that said second pair of transistors operate as a current mirror, said second pair of transistors having sources coupled to a positive voltage source and gates coupled to said internal node, said output node of said differential amplifier having a current that is a multiple of the difference between the voltages present on said gates of said first pair of transistors, and said internal node having a current which is the complement of the current on said output node of said differential amplifier;
    a push pull transconductance stage, coupled to said differential amplifer stage and to said predetermined load, the transconductance of said push pull transconductance stage being approximately equal to the reciprocal of the impedance of said load, said push pull transconductance stage having approximately a unity gain to provide amplification of wide bandwidth signals with minimal phase shift, said push pull transcondutance stage having a first driver transistor, coupled to said differential amplifier stage, for driving said output signal and having a second driver transistor, coupled to said first driver transistor for driving said output signal, said push pull transconductance stage further comprising:

a first transistor having a gate coupled to said internal node, a source coupled to said positive voltage source, and a drain coupled to the gate of said second driver transistor;

a second transistor having a gate coupled to said output node of said differential amplifier, a source coupled to said positive voltage source, and a drain;

a third transistor having a source coupled to a negative voltage source and a drain coupled to said drain of said second transistor, and having a gate coupled to said drain of said third transistor;

a fourth transistor having a source coupled to said negative voltage source and a gate coupled to said gate of said third transistor and a drain coupled to said drain of said first transistor;

a fifth transistor having a source coupled to said negative voltage source and having a drain coupled to said drain of said first transistor and having a gate coupled to said drain of said first transistor.

4. The amplifier circuit as described in claim 3 where said output node is coupled to the gate of said first driver transistor, said first driver transistor having a source coupled to said positive voltage source and a drain coupled to said output signal such that said differential amplifier stage controls the amount of current that can pass through said first driver transistor.

5. The amplifier circuit as described in claim 4 where said first pair of transistors and said first transistor have relatively low impedances, creating a driver path such that said second driver transistor is relatively quickly affected by changes in the difference between the voltages present on the gates of said first pair of transistors.

6. The amplifier circuit as described in claim 5 wherein said first transistor is approximately twice the size of said second transistor, such that under normal bias conditions the drain current present on said first transistor is approximately twice that of the drain current present on said second transistor.

7. The amplifier circuit as described in claim 6 where said fourth and said fifth transistors are matched such that under normal bias conditions the drain current present on said fourth transistor is approximately equal to the drain current present on said fifth transistor.

8. The amplifier circuit as described in claim 7 where said first driver transistor is approximately five times the size of said second transistor, such that under normal bias conditions the drain current present on said first driver transistor is approximately five times the drain current present on said second transistor.

9. The amplifier circuit as described in claim 8 where said second driver transistor is approximately five times the size of said fifth transistor, such that under normal bias conditions the drain current present on said second driver transistor is approximately five times the drain current present on said fifth transistor.

10. The amplifier as described in claim 9 where said driver path allows for changes in said differential input signals to affect said second driver transistor in approximately the same amount of time said output node affects said first driver transistor.

11. An operational amplifier circuit, having a positive voltage source, a negative voltage source, a current source, an input signal, a feedback line, and providing an output signal, said operation amplifier comprising:

first and second driver transistors, said first driver transistor having a source coupled to said positive source and drain to said output line, said second driver transistor having a drain coupled to said output line and a source coupled to said negative source, said first and second driver transistor's drains providing an output signal;

first pair of transistors, having a left side transistor having a gate coupled to said input line, a drain coupled to an output node, and a source coupled to said current source, and a right side transistor having a gate coupled to said feedback line, a drain coupled to an internal node, and a source coupled to said current source;

second pair of transistors, having two sources coupled to said positive source, two gates coupled to said internal node, and two drains, one coupled to said output node and one coupled to said internal node such that said second pair of transistors operates as a current minor of said first pair of transistors;

said output node configured such that the current present on said output node is a multiple of the difference between the voltages present on said input line and said feedback line;

internal node configured such that the current present on said internal node is equal to the current provided by said current source less the current present on said output node;

first transistor having a source coupled to said positive source and a gate coupled to said internal node, said first transistor having a relatively low impedance;

second transistor having a source coupled to said positive source and a gate coupled to said output node;

third transistor having a source coupled to said negative source;

fourth transistor having a source coupled to said negative source;

fifth transistor having a source coupled to said negative source;

said second transistor having a drain coupled to the drain of said third transistor and to the gates of said third transistor and said fourth transistor;

said first transistor having a drain coupled to the drains of said fourth transistor and said fifth transistor, and to the gates of said fifth transistor and said second driver transistor;

said third, fourth, and fifth transistors having approximately equal sizes;

said first transistor having approximately twice the size of said second transistor;

said first driver transistor having approximately five times the size of said second transistor.

* * * * *

UNITED STATES PATENT AND TRADEMARK OFFICE
CERTIFICATE OF CORRECTION

PATENT NO. : 4,859,963
DATED : August 22, 1989
INVENTOR(S) : Schaffer et al.

It is certified that an error appears in the above-identified patent and that said Letters Patent is hereby corrected as shown below:

In column 8 at line 8, please delete " minor " and insert -- mirror --.

In column 10 at line 6, please delete " operation " and insert -- operational --.

Signed and Sealed this

Fifteenth Day of October, 1996

Attest:

BRUCE LEHMAN

Attesting Officer          Commissioner of Patents and Trademarks